(12) United States Patent
Bezel et al.

(10) Patent No.: US 10,714,307 B2
(45) Date of Patent: Jul. 14, 2020

(54) NEUTRAL ATOM IMAGING SYSTEM

(71) Applicant: KLA-Tencor Corporation, Milpitas, CA (US)

(72) Inventors: Ilya Bezel, Mountain View, CA (US); Eugene Shifrin, Sunnyvale, CA (US); Gildardo Delgado, Livermore, CA (US); Rudy F. Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/141,150

(22) Filed: Sep. 25, 2018

(65) Prior Publication Data

US 2019/0378684 A1 Dec. 12, 2019

Related U.S. Application Data

(60) Provisional application No. 62/682,173, filed on Jun. 8, 2018.

(51) Int. Cl.
*H01J 37/26* (2006.01)
*H01J 37/08* (2006.01)
(Continued)

(52) U.S. Cl.
CPC ............ *H01J 37/265* (2013.01); *H01J 37/00* (2013.01); *H01J 37/08* (2013.01); *H01J 37/28* (2013.01);
(Continued)

(58) Field of Classification Search
CPC .... G21K 1/14; G21K 5/00; G21K 5/04; H01J 37/265; H01J 37/304; H01J 37/08; H01J 37/28; H01J 37/3174
See application file for complete search history.

(56) References Cited

U.S. PATENT DOCUMENTS 3,363,124 A * 1/1968 Warnecke, Jr. ........ F03H 1/0025
313/361.1
3,767,925 A * 10/1973 Foley, Jr. ............ G01N 23/2073
250/251
(Continued)

FOREIGN PATENT DOCUMENTS

JP S63244748 A 10/1988
JP 2000332073 A 11/2000
(Continued)

OTHER PUBLICATIONS

International Search Report and Written Opinion dated Oct. 25, 2019 for PCT/US2019/035902.
(Continued)

*Primary Examiner* — Brooke Purinton
(74) *Attorney, Agent, or Firm* — Suiter Swantz pc llo

(57) ABSTRACT

An imaging system utilizing atomic atoms is provided. The system may include a neutral atom source configured to generate a beam of neutral atoms. The system may also include an ionizer configured to collect neutral atoms scattered from the surface of a sample. The ionizer may also be configured to ionize the collected neutral atoms. The system may also include a selector configured to receive ions from the ionizer and selectively filter received ions. The system may also include one or more optical elements configured to direct selected ions to a detector. The detector may be configured to generate one or more images of the surface of the sample based on the received ions.

23 Claims, 5 Drawing Sheets

(51) Int. Cl.
*H01J 37/304* (2006.01)
*H01J 37/28* (2006.01)
*H01J 37/317* (2006.01)
*H01J 37/00* (2006.01)

(52) U.S. Cl.
CPC ........ *H01J 37/304* (2013.01); *H01J 37/3174* (2013.01)

(56) References Cited

U.S. PATENT DOCUMENTS

| | | | | |
|---|---|---|---|---|
| 4,081,674 | A | * | 3/1978 | Tamura ................ G01N 23/225 250/251 |
| 4,713,542 | A | * | 12/1987 | Campana ................ G21K 1/14 250/251 |
| 5,061,850 | A | * | 10/1991 | Kelly .................... H01J 37/045 250/287 |
| 5,468,955 | A | * | 11/1995 | Chen ........................ H05H 3/02 250/251 |
| 8,629,393 | B1 | * | 1/2014 | Kirkpatrick ............. H01J 37/05 250/251 |
| 8,729,468 | B2 | | 5/2014 | Kim et al. |
| 8,748,845 | B2 | | 6/2014 | Ward et al. |
| 9,123,503 | B2 | | 9/2015 | Kim et al. |
| 2009/0111036 | A1 | | 4/2009 | Stewart et al. |
| 2013/0156939 | A1 | | 6/2013 | Budach et al. |
| 2013/0320202 | A1 | | 12/2013 | McClelland et al. |
| 2015/0213996 | A1 | | 7/2015 | Kirkpatrick et al. |
| 2015/0213997 | A1 | | 7/2015 | Ward et al. |
| 2018/0024111 | A1 | | 1/2018 | Angelo |

FOREIGN PATENT DOCUMENTS

| | | |
|---|---|---|
| JP | 2014036086 A | 2/2014 |
| KR | 20010035954 A | 5/2001 |

OTHER PUBLICATIONS

Postek, Michael T. et al., "Helium Ion Microscopy and Its Application to Nanotechnology and Nanometrology", Scanning vol. 30, 6 (2008), pp. 457-462.

van Gastel, Raoul et al., "Subsurface analysis of semiconductor structures with helium ion microscopy", Microelectroncis Reliability, vol. 52, Issues 9-10, Sep.-Oct. 2012, pp. 2104-2109 (Abstract), https://www.sciencedirect.com/science/article/pii/S0026271412003277.

* cited by examiner

NEUTRAL ATOM IMAGING SYSTEM

CROSS-REFERENCE TO RELATED APPLICATION

The present application claims the benefit under 35 U.S.C. § 119(e) of U.S. Provisional Application Ser. No. 62/682,173, filed Jun. 8, 2018, entitled NEUTRAL HE INSPECTOR, naming Ilya Bezel, Eugene Shifrin, Gil Delgado, and Rudy Garcia as inventors, which is incorporated herein by reference in the entirety.

TECHNICAL FIELD

The present invention generally relates to inspection systems and methods and, more particularly, to inspection systems and methods utilizing neutral atoms.

BACKGROUND

Optical sample inspection and/or metrology techniques, such as deep ultraviolet (DUV) and vacuum ultraviolet (VUV) techniques, may exhibit desirable inspection/metrology speeds, but may suffer from limited spatial resolution. Optical sample inspection/metrology techniques may additionally exhibit a low signal to noise (S/N) ratio when analyzing defects less than five nanometers in size. On the other hand, electron beam (E-beam) scanning inspection and atomic force microscopy (AFM) techniques may be too slow for some implementations. Furthermore, the resolution of E-beam scanning inspection/metrology techniques may be limited by charging effects in the focused beam and on the sample. Therefore, it would be desirable to provide a system and method that cure one or more of the shortfalls of the previous approaches identified above.

SUMMARY

A neutral atom imaging system is disclosed, in accordance with one or more embodiments of the present disclosure. In one embodiment, the system includes a neutral atom source configured to generate a beam of neutral atoms and direct the beam to a sample. In another embodiment, the system includes an ionizer configured to collect neutral atoms scattered from the surface of the sample and to ionize the collected neutral atoms to generate ionized atoms. In another embodiment, the system includes a selector configured to receive the ionized atoms from the ionizer and to selectively filter the ionized atoms. In another embodiment, the system includes one or more ion optics and a detector. In one embodiment, the one or more ion optics are configured to receive selected ionized atoms from the selector and focus the selected ionized atoms onto the detector. In another embodiment, the detector is configured to generate one or more images of the sample based on the received selected ionized atoms.

A neutral atom imaging system is disclosed, in accordance with one or more embodiments of the present disclosure. In one embodiment, the system includes a neutral helium imaging sub-system. In another embodiment, the neutral helium imaging sub-system comprises a neutral helium atom source, an ionizer, a selector, one or more ion optics, and a detector. In another embodiment, the system includes a controller comprising a memory and one or more processors. In another embodiment, the controller is configured to receive one or more images from the detector and determine one or more characteristics of the sample based on the one or more images.

A method of imaging using neutral atoms is disclosed, in accordance with one or more embodiments of the present disclosure. In one embodiment, the method includes generating a beam of neutral atoms. In another embodiment, the method includes directing the beam of neutral atoms to the surface of a sample. In another embodiment, the method includes collecting neutral atoms scattered from the surface of the sample. In another embodiment, the method includes ionizing the collected neutral atoms to generate ionized atoms. In another embodiment, the method includes selectively filtering the ionized atoms. In another embodiment, the method includes generating one or more images of the sample based on the received selected ions.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1-4, systems and methods for sample inspection and/or metrology utilizing neutral atoms are described, in accordance with one or more embodiments of the present disclosure.

Embodiments of the present disclosure are directed to sample inspection and/or metrology systems utilizing neutral atomic species (e.g., neutral atoms) which are able to provide high resolution imaging capabilities. Additional embodiments of the present disclosure are directed at utilizing an ionizer and a fast atom selector to separate high-velocity atoms generated by a neutral atom source and scattered from the surface of a sample from lower-velocity background gas. Additional embodiments of the present disclosure are directed to methods of utilizing neutral atoms in sample inspection and/or imaging metrology.

It is noted herein that the imaging systems and methods of the present disclosure utilizing neutral atoms may provide numerous advantages over previous approaches, including optical inspection and E-beam inspection. For example, neutral atoms imaging may provide improved spatial resolution as compared to E-beam inspection, and may benefit in that interactions with the surface of the sample are made with neutral (e.g., uncharged) atoms. Additionally, the systems and methods of the present disclosure may be sensitive to surface structures and less sensitive to outside errors, while maintaining a high inspection speed/throughput (e.g., wafers/hour). Furthermore, imaging systems and methods utilizing neutral atoms may benefit from the low landing energy of the neutral atoms. Due to the low landing energy of the neutral atoms, the neutral atoms land with minimum penetration depth, making the systems and methods of the present disclosure more sensitive to the surface morphology of the sample. Lastly, low landing energy may minimize changes which are made to the surface of the sample as compared to imaging systems and methods which exhibit high landing energy (e.g., energetic ion beams, short wavelength radiation, and the like).

Figure 1:
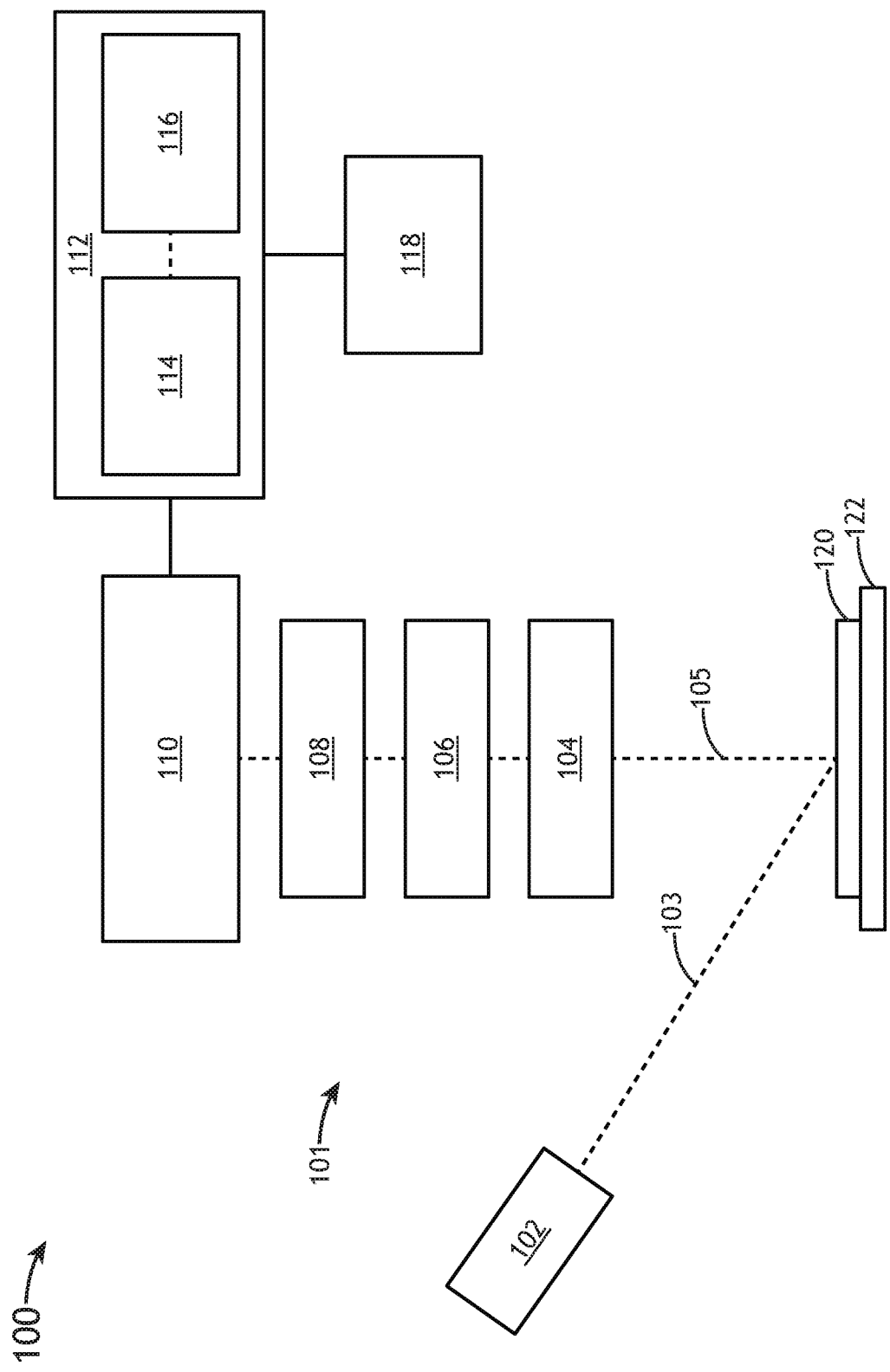
FIG. 1 illustrates a neutral atom imaging system, in accordance with one or more embodiments of the present disclosure.

FIG. 1 illustrates a neutral atom imaging system 100, in accordance with one or more embodiments of the present disclosure. In one embodiment, system 100 includes a neutral atom imaging sub-system 101. The neutral atom imaging sub-system 101 may include, but is not limited to, a neutral atom source 102, an ionizer 104, a selector 106, one or more ion optics 108, and a detector 110. In another embodiment, the system 100 includes a controller 112.

In one embodiment, neutral atom imaging sub-system 101 of system 100 is configured to characterize, image, inspect, or measure a sample 120. Sample 120 may include any sample known in the art including, but not limited to, a wafer, a semiconductor wafer, a reticle, a mask (e.g., photomask), and the like. In one embodiment, neutral atom source 102 is configured to generate a beam of neutral atoms (hereinafter "neutral atom beam 103" or "beam 103") and direct the neutral atom beam 103 to the surface of the sample 120. The neutral atom source 102 may include any neutral atom source configured to generate a beam of neutral atoms known in the art including, but not limited to, a supersonic nozzle (discussed further herein). By way of another example, neutral atom source 102 may include a plasmatron source operated with electrically-sustained or laser-sustained plasmas. By way of another example, neutral atom source 102 may include an ion beam that is accelerated, shaped, recharged to form neutrals, and cleaned from residual ions.

It is noted herein that neutral atom beam 103 may be formed using a number of neutral atoms or molecules including, but not limited to, helium (He), neon (Ne), argon (Ar), hydrogen ($H_2$), nitrogen ($N_2$), oxygen ($O_2$), and the like. Although much of the present disclosure is directed to the use of "neutral atoms," this is not to be regarded as limiting. In this regard, neutral molecules and other neutral particles may be used without departing from the spirit or scope of the present disclosure.

In one embodiment, the neutral atom source 102 is configured to direct the neutral atom beam 103 to the sample 120 such that the neutral atom beam 103 is incident on the sample 120 in a particular configuration. For example, the neutral atom source 102 may be configured to direct the neutral atom beam 103 to the sample 120 such that the neutral atom beam 103 is incident on the sample 120 forming a spot of a particular diameter. For instance, the spot may be approximately 0.2 mm in diameter.

In one embodiment, the neutral atom source 102 directs the neutral atoms of the neutral atom beam 103 to the sample 120 with velocities higher than that of surrounding particles. By way of example, system 100 may be maintained at or near room temperature. Accordingly, atoms in the background/surrounding environment may exhibit a lower velocity corresponding to the room temperature. The neutral atom source 102 may heat and/or accelerate the neutral atoms of the neutral atom beam 103 such that the neutral atoms of the neutral atom beam 103 strike the surface of the sample 120 with higher velocities than the atoms/particles of the surrounding environment. For instance, if system 100 includes an environment of helium maintained at room temperature, the neutral helium atoms of the neutral atom beam 103 (neutral helium beam) may be heated and/or accelerated to strike the sample 120 with higher velocities than helium atoms of the surrounding environment (e.g., "background" atoms or "surrounding environment" atoms"). It is noted herein that the terms "background atoms" and "surrounding environment atoms," may be used interchangeably for the purposes of the present disclosure.

In one embodiment, sample 120 is disposed on a stage assembly 122 to facilitate the movement of sample 120. Stage assembly 122 may include any stage assembly known in the art including, but not limited to, an X-Y stage and/or an R-θ stage. In one embodiment, stage assembly 122 is capable of adjusting the height of sample 120 during inspection to maintain focus on the sample 120.

In another embodiment, neutral atoms of the neutral atom beam 103 which are scattered from the sample 120 (e.g., scattered neutral atoms 105) are collected by the ionizer 104. In another embodiment, the ionizer 104 is configured to ionize the collected neutral atoms. For example, where the neutral atom beam 103 and surrounding environment includes neutral helium atoms, the ionizer 104 may be configured to ionize the collected neutral helium atoms to form helium ions. The ionizer 104 may ionize collected atoms, molecules, or particles using any method known in the art including, but not limited to, a defocused electron beam (E-beam), optical excitation, and the like. Ionization by a defocused electron beam will be discussed in further detail herein with reference to FIG. 2A.

In another embodiment, ions generated by the ionizer 104 are directed to the selector 106. Selector 106 may include any device or apparatus configured to selectively filter and/or separate ions including, but not limited to, electrostatic meshes, retarding grids, magnetic prisms, reflectrons, and the like. The selector 106 may be configured to selectively filter ions which originate from the neutral atom beam 103 from ions which originate from the background/surrounding environment. For example, as noted previously, neutral atoms of the neutral atom beam 103 may exhibit higher velocities than neutral atoms of the surrounding environment (background atoms). Accordingly, the selector 106 may be configured to selectively filter ions with high velocities (originating from the neutral atom beam 103) from ions with lower velocities (originating from the background or surrounding environment). For instance, in a preferred embodiment, selector 106 may be configured to separate and/or block lower-velocity helium ions such that only high-velocity helium ions pass through the selector 106. For the purposes of the present disclosure, ions passing through (or otherwise coming from) the selector 106 may be referred to as "selected ions" whereas ions blocked and/or separated from the selector 106 may be referred to as "separated ions."

In another embodiment, selected ions (e.g., ions not blocked or separated by the selector 106) are directed by one or more ion optics 108 to the detector 110. The one or more ion optics 108 may include any optical components configured to direct and/or focus the selected ions including, but not limited to, electrostatic lenses, electromagnetic lenses, and the like. The detector 110 may include any detector for imaging ions known in the art. In another embodiment, the detector 110 may be configured to receive the selected ions and generate one or more images based on the selected ions.

It is noted herein that helium atom wavelengths are short, with a de Broglie wavelength of approximately 0.01 nm. With such short wavelengths, the resolution of the one or more images generated by the detector 110 may be dependent on aberrations in the selector 106 and/or one or more ion optics 108. In this regard, it is contemplated that systems and methods of the present disclosure may be capable of generating images of a sample 120 which exceed the resolution of electron beam systems.

The detector 110 may be communicatively coupled to the controller 112. In one embodiment, controller 112 includes one or more processors 114 and a memory 116. In another embodiment, the one or more processors 114 may be configured to execute a set of program instructions stored in memory 116, wherein the set of program instructions are configured to cause the one or more processors 114 to carry out one or more steps of the present disclosure. In another embodiment, the controller 112 is communicatively coupled to a user interface 118. The user interface 118 may include any user interface known in the art for displaying information, receiving inputs from a user, and the like. In this regard, the user interface 118 and/or controller 112 may be configured to analyze, adjust, or modify one or more of the components, tools, and sub-systems of system 100.

In one embodiment, the controller 112 may be configured to acquire and/or receive the one or more images from the detector 110. In another embodiment, the one or more processors 114 of controller 112 may be configured to determine one or more characteristics of the sample 120 based on the one or more images received from detector 110. For example, the one or more processors 114 may be configured to execute the set of program instructions on memory 116, the set of program instructions configured to cause the one or more processors 114 to carry out one or more algorithms, analyses, inspection techniques, metrology techniques, and the like, in order to determine one or more characteristics of the sample 120. The one or more characteristics of the sample 120 may include any characteristics known in the art of imaging and/or inspection including, but not limited to, a surface profile of the sample, one or more measurements of the sample, the existence of one or more defects, the absence of defects, and the like.

In another embodiment, the one or more images generated by the detector 110 and/or the one or more characteristics determined by the one or more processors 114 may be stored in memory 116. In another embodiment, the one or more processors 114 may be configured to modify, alter, or adjust one or more tools (e.g., one or more components of system 100, one or more tools of an upstream sample production process, one or more tools of a downstream process, or the like) based on the one or more determined characteristics of sample 120.

Figure 2A:
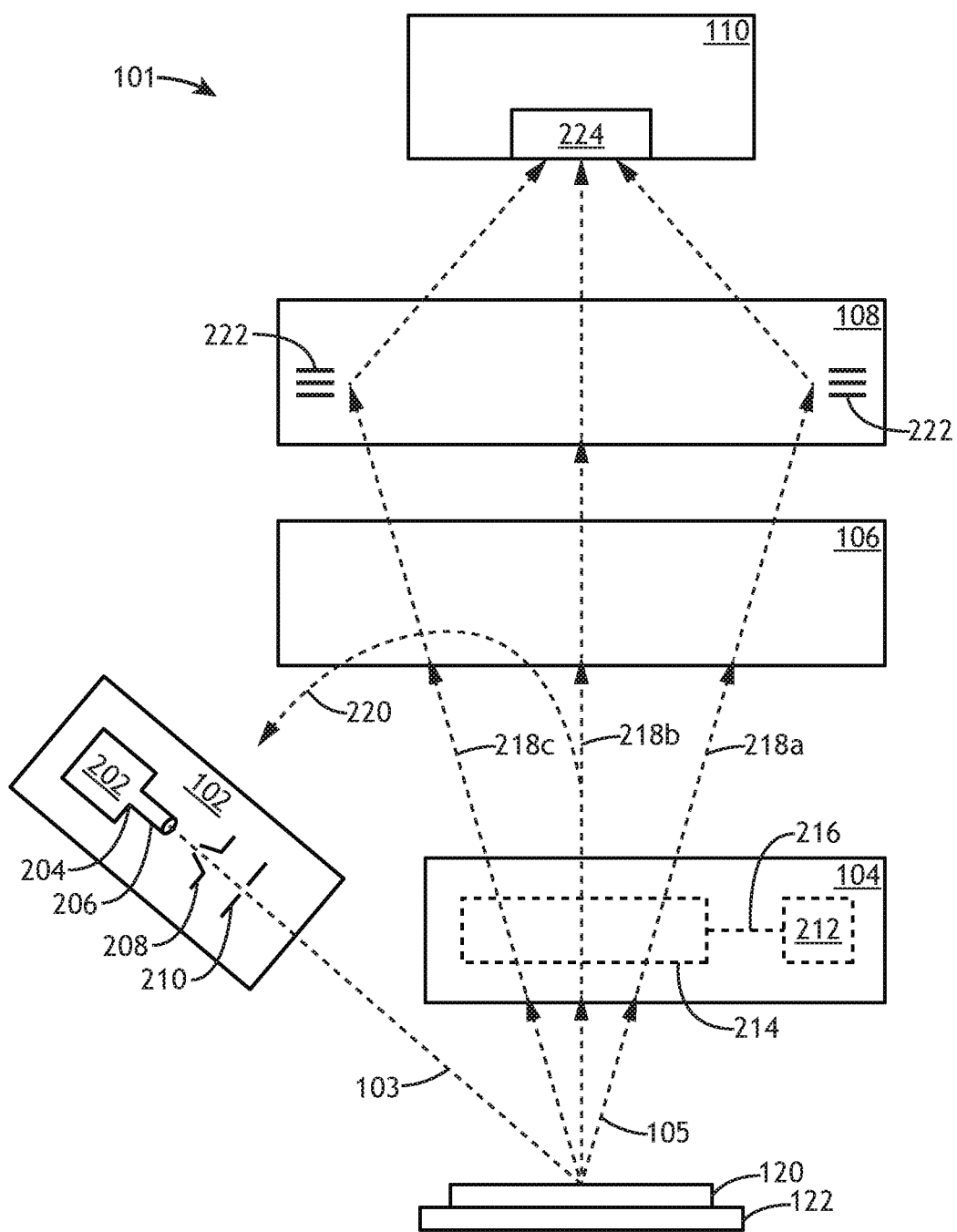
FIGS. 2A-2B illustrate a neutral atom imaging sub-system, in accordance with one or more embodiments of the present disclosure.

FIG. 2A illustrates a neutral atom imaging sub-system 101, in accordance with one or more embodiments of the present disclosure. As noted previously herein, the neutral atom imaging sub-system 101 may include a neutral atom source 102, an ionizer 104, a selector 106, one or more ion optics 108, and a detector 110.

As noted previously, neutral atom source 102 may include any neutral atom source configured to generate a neutral atom beam 103 known in the art. By way of example, FIG. 2A illustrates a neutral atom source 102 including a supersonic nozzle 204. As shown in FIG. 2A, the neutral atom source 102 may include a chamber 202, a nozzle 204, a heated tube 206, a skimmer 208, and a collimator 210. The chamber 202 may include any chamber configured to contain a volume of neutral gas, such as helium. In one embodiment, neutral atoms are heated within the chamber 202 and pass through an opening in the chamber 202 to the heated nozzle 204 (e.g., heated supersonic nozzle 204) to the heated tube 206. The heated tube 206 may be made of any material known in the art including, but not limited to, ceramic.

In one embodiment, neutral atoms passing through the heated tube 206 are heated to a predetermined temperature and/or energy level. For example, neutral helium atoms may be heated by the heated tube 206 to a temperature of approximately 2,000 K and a kinetic energy of approximately 0.4 eV. Predetermined temperature levels and/or energy levels may be determined by any number of factors. For example, neutral atoms may be heated to a predetermined temperature or predetermined energy level which will achieve sufficient ion separation in the selector 106. Separation of atoms/ions based on temperatures and energy levels is described in further detail herein with reference to FIG. 3.

Continuing with reference to FIG. 2A, heated neutral atoms may exit the heated tube 206 and pass through the skimmer 208 and/or collimator 210 before exiting the neutral atom source 102. It is noted herein that the neutral atom source 102 may include one or more differentially pumped chambers so as to maintain separation between the neutral atom source 102 and the rest of the neutral atom imaging sub-system 101.

In one embodiment, high-velocity neutral atoms of neutral atom beam 103 are directed to the surface of sample 120. In another embodiment, ionizer 104 is configured to collect neutral atoms scattered from the surface of the sample 120, In another embodiment, the ionizer 104 is configured to ionize the collected neutral atoms. For example, where the neutral atom beam 103 and surrounding environment includes neutral helium atoms, the ionizer 104 may be configured to ionize the collected neutral helium atoms to form helium ions.

In one embodiment, as depicted in FIG. 2A, ionizer 104 may include an electron beam source 212 configured to generate a defocused electron beam 216. The defocused electron beam 216 may ionize neutral atoms passing through the ionizer in the ionization region 214. It is noted herein that neutral atoms collected and ionized by ionizer 104 may include both neutral atoms originating from the neutral atom beam 103 as well as background atoms (e.g., surrounding environment atoms). For example, system 100 may include a surrounding environment of neutral helium, and neutral atom source 102 may be configured to generate a neutral atom beam 103 of neutral helium atoms. In this example, ionizer 104 may collect and ionize both neutral helium atoms from the neutral atom beam 103 (e.g., high-velocity, high temperature helium atoms) as well as neutral helium atoms from the surrounding environment (background helium atoms) (e.g., low-velocity, low-temperature helium atoms).

Ions generated by the ionizer 104 may be directed to the selector 106. As noted previously, selector 106 may include any device or apparatus configured to selectively filter and/or separate ions including, but not limited to, electrostatic meshes, retarding grids, magnetic prisms, reflectrons, and the like. Selector 106 may selectively filter, separate, and/or reject ions based on any methodologies known in the art including, but not limited to, the application of acceleration potentials, retardation potentials, and the like. In one embodiment, selector 106 may selectively filter and/or separate ions such that high-velocity, high-temperature ions (e.g., ions originating from the neutral atom beam 103) may pass through the selector 106, whereas low-velocity, low-temperature ions (e.g., ions originating from background atoms) may not pass through the selector 106. For example, as shown in FIG. 2A, high-velocity ions 218a, 218b, 218c may pass through selector 106, while low-velocity ions 220 may be selectively filtered, separated, and/or rejected. In this regard, the terms "high-velocity ions 218" and "selected ions" may be used interchangeably throughout the present disclosure. Similarly, the terms "low-velocity ions 220" and "separated ions" may be used interchangeably throughout the present disclosure.

As noted previously herein, neutral atoms may be heated and accelerated in the neutral atom source 102 to a predetermined temperature and predetermined kinetic energy level so as to maintain a sufficient level of ion separation (e.g., separation of high-velocity and low-velocity ions) within selector 106. Separation of ions based on temperatures and energy levels is described in further detail herein with reference to FIG. 3.

Figure 2B:
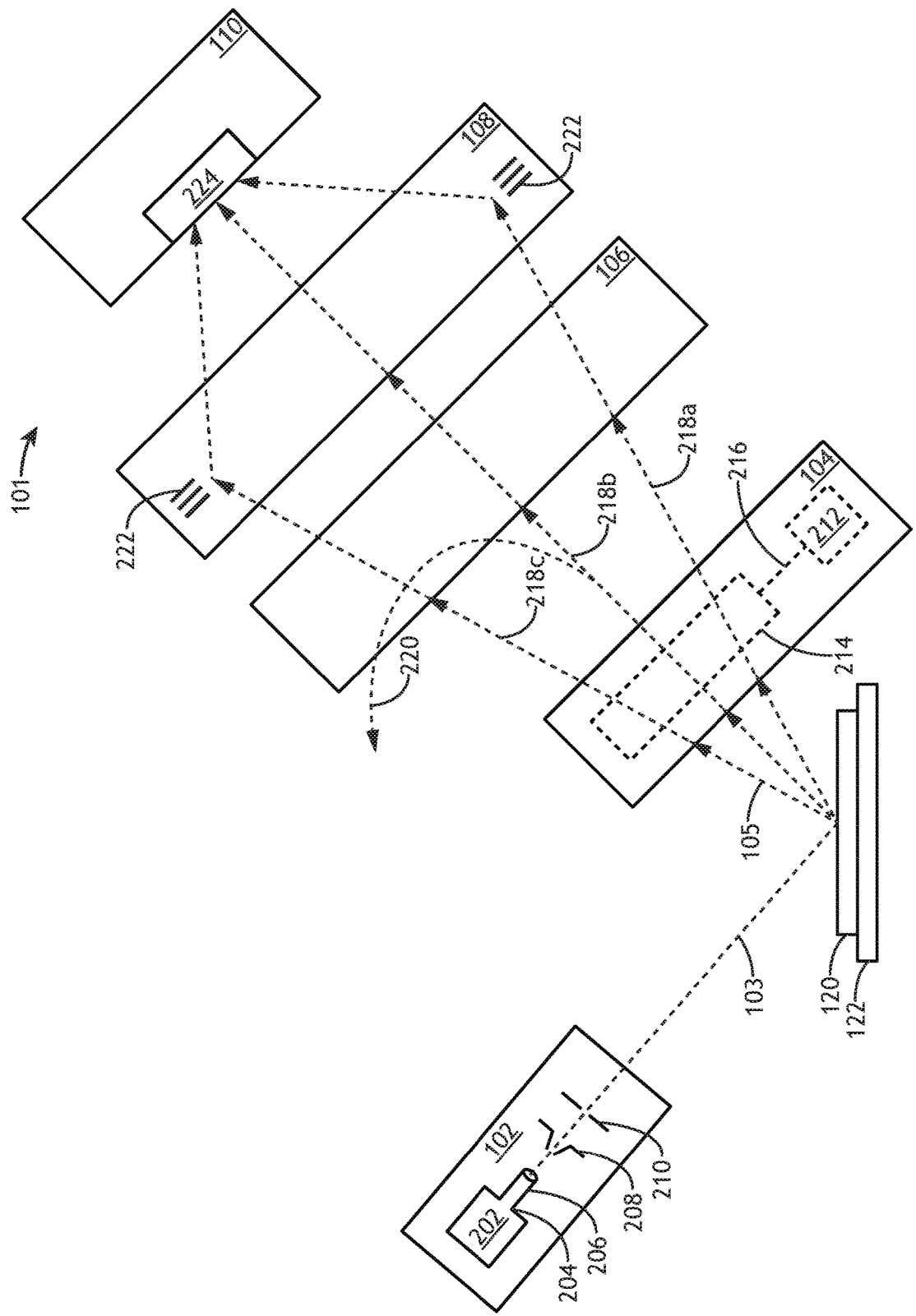

It is noted herein that the dark field configurations of FIGS. 1 and 2A are provided solely for illustrative purposes, and are not to be regarded as a limitation of the present disclosure, unless noted otherwise herein. In this regard, it is contemplated herein that system 100 may be arranged in any configuration known in the art including, but not limited to, dark field configurations (as depicted in FIGS. 1 and 2A), and/or bright field configurations. For example, FIG. 2B depicts neutral atom imaging sub-system 101 in a bright field configuration.

Figure 3:
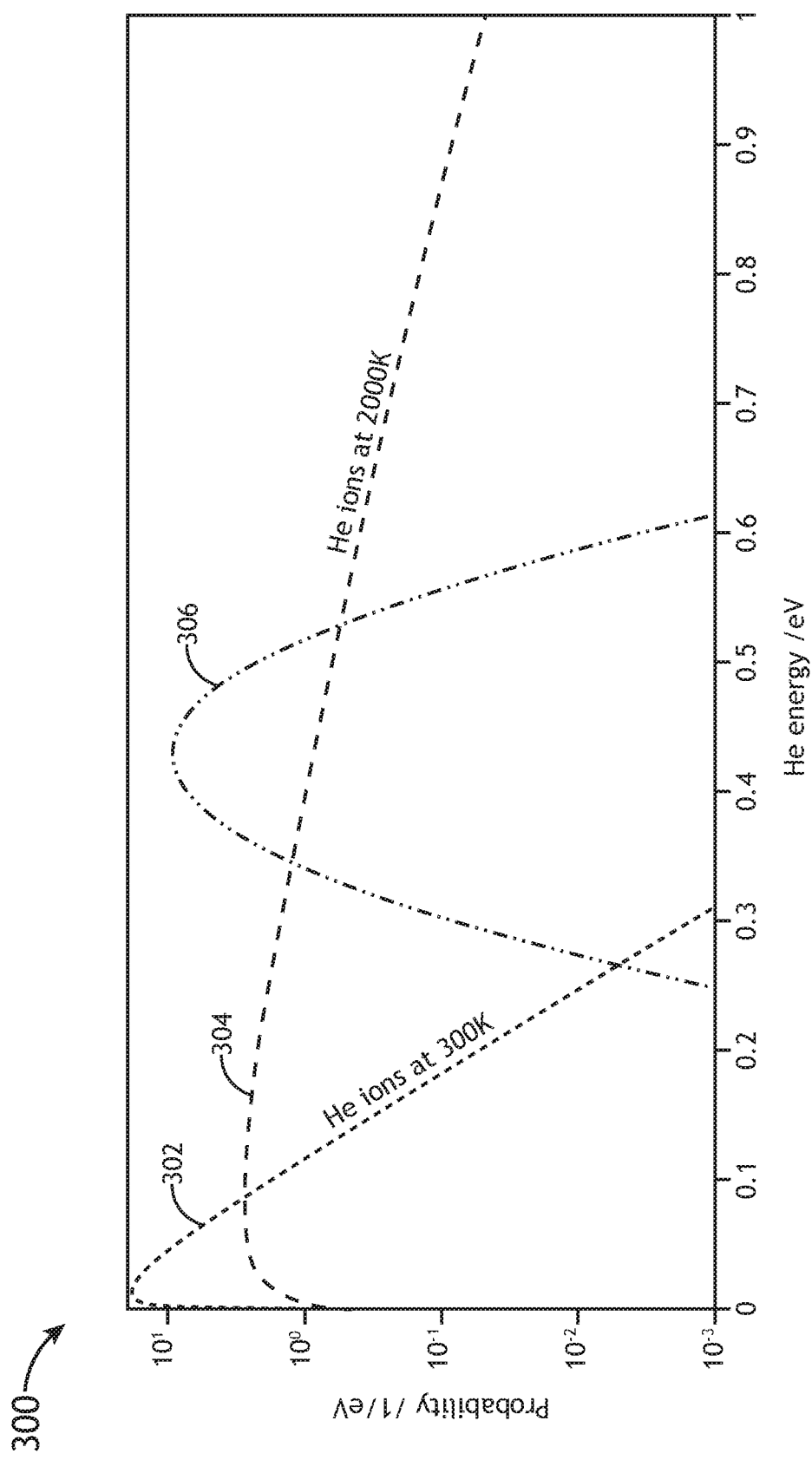
FIG. 3 illustrates a graph illustrating probability distributions of helium atom energy levels, in accordance with one or more embodiments of the present disclosure.

FIG. 3 illustrates a graph 300 illustrating probability distributions of helium ion energy levels, in accordance with one or more embodiments of the present disclosure. In one embodiment, curve 302 illustrates the energy distribution of helium ions heated to 300 K. In another embodiment, curve 304 illustrates the energy distribution of helium ions heated to 2,000 K. In another embodiment, curve 306 illustrates the energy distribution of helium ions following a supersonic expansion process.

As shown in FIG. 3, at low energy levels, there is a relatively high probability that both 300 K helium ions (curve 302) and 2,000 K helium ions (curve 304) may be present. Comparatively, at energy levels of approximately 3.1 eV and above, the probability that 300 K helium ions (curve 302) will be present is approximately zero, while the probability that 2,000 K helium ions (curve 304) will be present remains relatively high. In this regard, it is contemplated that selector 106 may selectively filter (e.g., select, separate, block) ions based on kinetic energy (e.g., temperature). Accordingly, in embodiments where neutral atoms are heated and accelerated by the neutral atom source 102, there may be a correlation between high temperature atoms/ions with high velocity atoms/ions. Thus, selector 106 may effectively filter ions according to velocity based on the correlation between temperature and velocity.

Returning to FIG. 2A, one or more ion optics 108 may focus and/or direct selected ions (e.g., high-velocity ions 218) from the selector 106 to the detector 110. The one or more ion optics 108 may include any optical elements 222 known in the art configured to direct and/or focus the ions to one or more sensors 224 of detector 110.

It is further noted herein that the one or more components or sub-systems of the disclosed system may be communicatively coupled to the various other components of the system in any manner known in the art. For example, the detector 110 and controller 112 may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like)).

In one embodiment, the one or more processors 114 may include any one or more processing elements known in the art. In this sense, the one or more processors 114 may include any microprocessor-type device configured to execute software algorithms and/or instructions. In one embodiment, the one or more processors 114 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 114. In general, the term "processor" may be broadly defined to encompass any device having one or more processing elements, which execute program instructions from memory 116. Moreover, different subsystems of the system 100 (e.g., neutral atom imaging subsystem 101, neutral atom source 102, ionizer 104, selector 106, one or more ion optics 108, detector 110, controller 112, user interface 118, and the like) may include processor or logic elements suitable for carrying out at least a portion of the steps described throughout the present disclosure. Therefore, the above description should not be interpreted as a limitation on the present disclosure but merely an illustration.

The memory 116 may include any storage medium known in the art suitable for storing program instructions executable by the associated one or more processors 114. For example, the memory 116 may include a non-transitory memory medium. For instance, the memory 116 may include, but is not limited to, a read-only memory (ROM), a random access memory (RAM), a magnetic or optical memory device (e.g., disk), a magnetic tape, a solid state drive and the like. In another embodiment, the memory 116 is configured to store data including, but not limited to, the images generated by detector 110, or the one or more characteristics determined by the one or more processors 114, and the like. It is further noted that memory 116 may be housed in a common controller housing with the one or more processors 114. In an alternative embodiment, the memory 116 may be located remotely with respect to the physical location of the processors 114, controller 112, and the like. In another embodiment, the memory 116 maintains program instructions for causing the one or more processors 114 to carry out the various steps described through the present disclosure.

In one embodiment, the user interface 118 may include, but is not limited to, one or more desktops, tablets, smartphones, smart watches, or the like. In another embodiment, the user interface 118 includes a display used to display data of the system 100 to a user. The display of the user interface 118 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 118 is suitable for implementation in the present disclosure. In another embodiment, a user may input selections and/or instructions responsive to data displayed to the user via the user interface 118.

Figure 4:
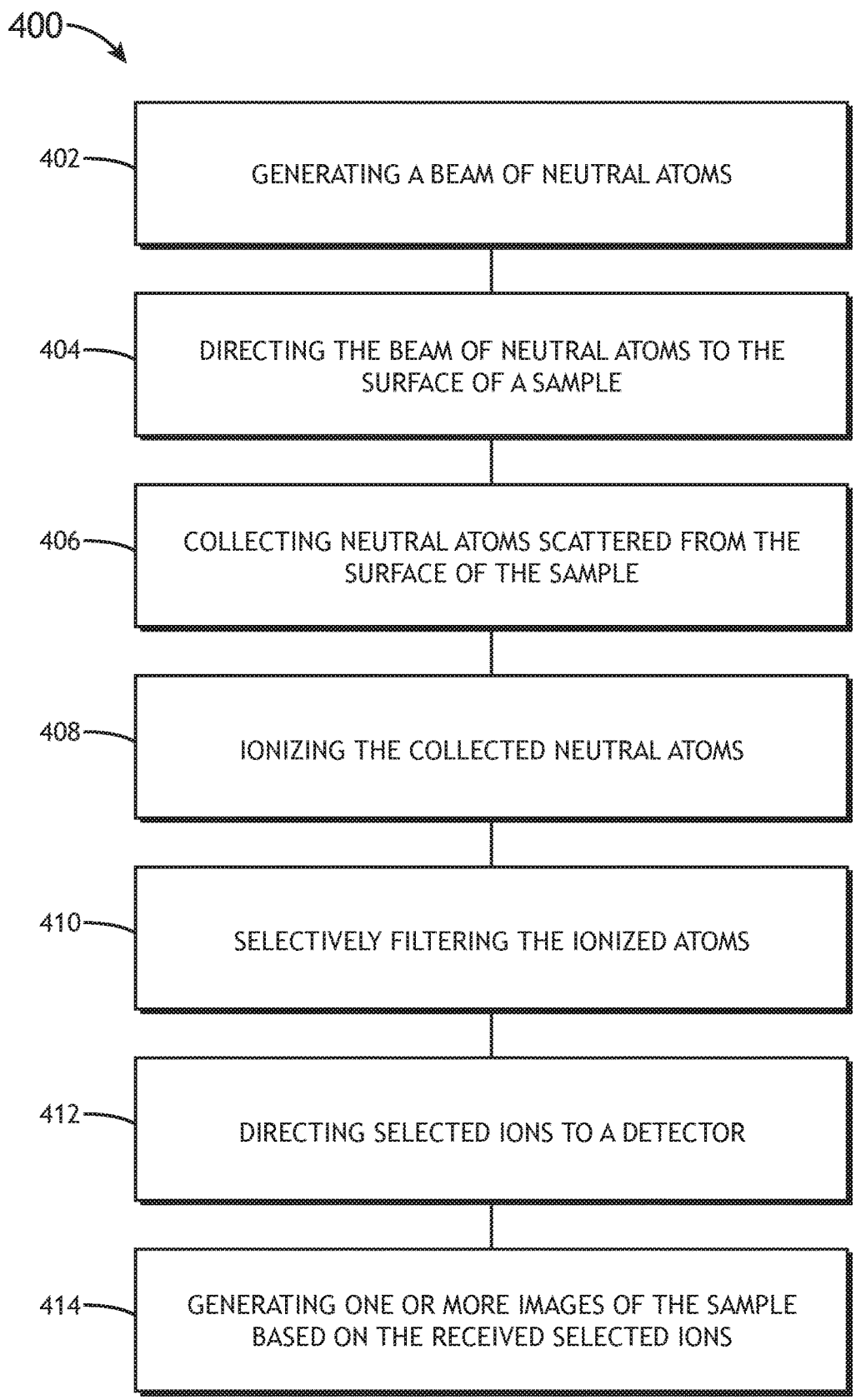
FIG. 4 illustrates a flowchart of a method for neutral atom imaging, in accordance with one or more embodiments of the present disclosure.

FIG. 4 illustrates a flowchart of a method 400 for neutral atom imaging, in accordance with one or more embodiments of the present disclosure. It is noted herein that the steps of method 400 may be implemented all or in part by system 100. It is further recognized, however, that the method 400 is not limited to the system 100 in that additional or alternative system-level embodiments may carry out all or part of the steps of method 400.

In a step 402, a beam of neutral atoms is generated. For example, the neutral atom source 102 may generate the neutral atom beam 103. The beam of neutral atoms may be generated using any method or apparatus known in the art including, but not limited to, a supersonic nozzle, a plasmatron source, or an ion beam which is recharged and cleaned from residual ions. It is noted herein that the beam of neutral atoms (neutral atom beam 103) may be formed using a number of neutral atoms or molecules including, but not limited to, helium (He), neon (Ne), argon (Ar), hydrogen ($H_2$), nitrogen ($N_2$), oxygen ($O_2$), and the like.

In a step 404, the beam of neutral atoms is directed to the surface of a sample. For example, as depicted in FIG. 2A, the neutral atom source 102 may direct the neutral atom beam 103 to the surface of the sample 120. The sample may include any sample or specimen known in the art including, but not limited to, a wafer, a semiconductor wafer, a reticle, a mask (e.g., photomask), and the like.

In a step 406, neutral atoms scattered from the surface of the sample are collected. For example, ionizer 104 may collect neutral atoms scattered from the surface of the sample.

In a step 408, collected neutral atoms are ionized. For example, the ionizer 104 may ionize collected atoms. The ionizer 104 may ionize collected atoms, molecules, or particles using any method known in the art including, but not limited to, a defocused electron beam (E-beam), optical excitation, and the like. It is noted herein that neutral atoms ionized by ionizer 104 may include both neutral atoms originating from the neutral atom beam 103 as well as background atoms (e.g., surrounding environment atoms).

In a step 410, the ionized atoms are selectively filtered. For example, selector 106 may selectively filter (e.g., filter, separate, block) ionized atoms (ions) from ionizer 104. Selector 106 may include any device or apparatus configured to selectively filter and/or separate ions including, but not limited to, electrostatic meshes, retarding grids, magnetic prisms, reflectrons, and the like. The selector 106 may be configured to selectively filter (e.g., separate) ions which originate from the neutral atom beam 103 from ions which originate from the background/surrounding environment. For instance, selector 106 may be configured to separate and/or block low-velocity ions such that only high-velocity ions pass through the selector 106.

In a step 412, selected ions are directed to a detector. As noted previously herein, for the purposes of the present disclosure, ions passing through (or otherwise coming from) the selector 106 may be referred to as "selected ions" whereas ions blocked and/or separated from the selector 106 may be referred to as "separated ions." In one embodiment, one or more ion optics 108 direct and/or focus selected ions to the detector 110. The one or more ion optics 108 may include any optical elements 222 known in the art for directing and/or focusing ions including, but not limited to, electrostatic lenses, electromagnetic lenses, and the like.

In a step 414, one or more images of the sample are generated based on the received selected ions. For example, detector 110 may generate one or more images of the sample 120 based on the selected ions received by detector 110. In another embodiment, a controller 112 may receive the one or more images generated by the detector 110 and determine one or more characteristics of the sample based on the received one or more images. The one or more characteristics of the sample may include any characteristics known in the art of imaging and/or inspection including, but not limited to, a surface profile of the sample, one or more measurements of the sample, the existence of one or more defects, the absence of defects, and the like.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A neutral atom imaging system, comprising:
   a neutral atom source configured to generate a beam of neutral atoms and direct the beam to a sample;
   an ionizer configured to collect neutral atoms scattered from the surface of the sample and to ionize the collected neutral atoms to generate ionized atoms;
   a selector configured to receive the ionized atoms from the ionizer and to selectively filter the ionized atoms;
   one or more ion optics; and
   a detector, wherein the one or more ion optics are configured to receive selected ionized atoms from the selector and focus the selected ionized atoms onto the detector, wherein the detector is configured to generate one or more images of the sample based on received selected ionized atoms.

2. The neutral atom imaging system of claim 1, further comprising:
a controller, wherein the controller is configured to receive the one or more images from the detector and determine one or more characteristics of the sample based on the one or more images.

3. The neutral atom imaging system of claim 1, wherein the sample comprises at least one of a wafer, a reticle, or a mask.

4. The neutral atom imaging system of claim 1, wherein the neutral atoms comprise at least one of atomic helium (He), atomic neon (Ne), or atomic argon (Ar).

5. The neutral atom imaging system of claim 1, wherein the neutral atom source comprises a chamber and a supersonic nozzle coupled to an opening in the chamber.

6. The neutral atom imaging system of claim 1, wherein the neutral atom source comprises a plasmatron source.

7. The neutral atom imaging system of claim 1, wherein the ionizer ionizes the collected neutral atoms scattered from the surface of the sample by optical excitation.

8. The neutral atom imaging system of claim 1, wherein the ionizer comprises a defocused electron beam (E-beam).

9. The neutral atom imaging system of claim 1, wherein the selector comprises at least one of an electrostatic mesh or a magnetic prism.

10. The neutral atom imaging system of claim 1, wherein the one or more ion optics comprise at least one of an electrostatic lens or electromagnetic lens.

11. The neutral atom imaging system of claim 1, wherein the selector is configured to selectively filter the ionized atoms by separating high-velocity ionized atoms from low-velocity ionized atoms.

12. A neutral atom imaging system, comprising:
a neutral helium imaging sub-system, wherein the neutral helium imaging sub-system comprises:
a neutral atom source configured to generate a beam of neutral atoms and direct the beam to a sample;
an ionizer configured to collect neutral atoms scattered from the surface of the sample and to ionize the collected neutral atoms to generate ionized atoms;
a selector configured to receive the ionized atoms from the ionizer and to selectively filter the ionized atoms;
one or more ion optics; and
a detector, wherein the one or more ion optics are configured to receive selected ionized atoms from the selector and focus the selected ionized atoms onto the detector, wherein the detector is configured to generate one or more images of the sample based on received selected ionized atoms; and
a controller comprising a memory and one or more processors, the controller configured to receive the one or more images from the detector and determine one or more characteristics of the sample based on the one or more images.

13. A method of imaging using neutral atoms, comprising:
generating a beam of neutral atoms;
directing the beam of neutral atoms to a surface of a sample;
collecting neutral atoms scattered from the surface of the sample;
ionizing collected neutral atoms to generate ionized atoms;
selectively filtering ionized atoms; and
generating one or more images of the sample based on received selected ionized atoms.

14. The method of claim 13, further comprising:
determining one or more characteristics of the sample based on the one or more images.

15. The method of claim 13, wherein the sample includes one of a wafer, a reticle, or a mask.

16. The method of claim 13, wherein the neutral atoms comprise at least one of atomic helium (He), atomic neon (Ne), or atomic argon (Ar).

17. The method of claim 13, wherein the generating a beam of neutral atoms comprises generating a beam of neutral atoms with a neutral atom source comprising a chamber and a supersonic nozzle coupled to an opening in the chamber.

18. The method of claim 13, wherein the generating a beam of neutral atoms comprises generating a beam of neutral atoms with a plasmatron source.

19. The method of claim 13, wherein the ionizing collected neutral atoms comprises ionizing collected neutral atoms by optical excitation.

20. The method of claim 13, wherein the ionizing collected neutral atoms comprises a defocused electron beam (E-beam).

21. The method of claim 13, wherein the selectively filtering ionized atoms comprises selectively filtering ionized atoms with at least one of an electrostatic mesh or a magnetic prism.

22. The method of claim 13, further comprising: directing the selected ionized atoms to a detector with at least one of an electrostatic lens or electromagnetic lens.

23. The method of claim 13, wherein the selectively filtering ionized atoms comprises selectively filtering the ionized atoms to allow ionized atoms originating from the beam of neutral atoms to pass to a detector.

* * * * *